United States Patent
Bautista et al.

[11] Patent Number: 6,125,272
[45] Date of Patent: Sep. 26, 2000

[54] METHOD AND APPARATUS PROVIDING IMPROVED INTERMODULATION DISTORTION PROTECTION

[75] Inventors: Edwin E. Bautista, Hollywood; Babak Bastani, Weston; Joseph P. Heck, Ft. Lauderdale, all of Fla.

[73] Assignee: Motorola, Inc., Schaumburg, Ill.

[21] Appl. No.: 09/160,934

[22] Filed: Sep. 25, 1998

[51] Int. Cl.[7] ................................................. H04B 1/26
[52] U.S. Cl. ........................... 455/326; 455/333; 327/359
[58] Field of Search ................................. 455/126, 295, 455/296, 63, 323, 326, 330, 332; 327/113, 356, 359

[56] References Cited

U.S. PATENT DOCUMENTS

| | | | |
|---|---|---|---|
| 3,617,913 | 11/1971 | Schmidhauser | 330/9 |
| 4,561,067 | 12/1985 | McKeown | 364/819 |
| 4,622,521 | 11/1986 | Redfern | 330/9 |
| 4,695,972 | 9/1987 | McKeown | 364/819 |
| 4,931,745 | 6/1990 | Goff et al. | 330/9 |
| 4,933,642 | 6/1990 | Lee | 330/9 |
| 4,947,135 | 8/1990 | Mijuskovic | 330/9 |
| 4,994,805 | 2/1991 | Dedie et al. | 341/143 |
| 5,148,167 | 9/1992 | Ribner | 341/143 |
| 5,222,255 | 6/1993 | Kuo | 455/266 |
| 5,307,515 | 4/1994 | Kuo | 455/295 |
| 5,307,517 | 4/1994 | Rich | 455/396 |
| 5,486,788 | 1/1996 | Schlager et al. | 330/9 |
| 5,715,532 | 2/1998 | Sagawa | 455/333 |
| 5,732,333 | 3/1998 | Cox | 455/126 |
| 5,749,051 | 5/1998 | Dent | 455/324 |
| 5,854,811 | 12/1998 | Sasaki | 375/296 |
| 5,933,771 | 8/1999 | Tiller | 455/333 |

OTHER PUBLICATIONS

Yamaji T., Tanimoto H., Kokatsu H., "SP 23.3: An I/Q Active Balanced Harmonic Mixer with IM2/Cancelers and 45° Phase Shifter" IEEE International Solid–State Circuits Conference, Digest of Technical Papers.

*Primary Examiner*—Daniel S. Hunter
*Assistant Examiner*—Nick Corsaro
*Attorney, Agent, or Firm*—Andrew S. Fuller

[57] ABSTRACT

Second order intermodulation distortion (IM2) occurs when two interfacing signals mix with each other through a second order nonlinearity to produce an intermodulation product at the sum and difference frequencies of the two interferers. To reduce the amount of intermodulation distortion, dynamic matching is employed. In practice, dynamic matching operates to transform coefficients of IM2 distortion from constant values into functions of time where they may be handled by known rejection techniques.

19 Claims, 11 Drawing Sheets

| DEVICE | PERIOD 1 | PERIOD 2 | PERIOD 3 | PERIOD 4 |
|---|---|---|---|---|
| M1 | L | M | K | J |
| M2 | M | K | J | L |
| M3 | K | J | L | M |
| M4 | J | L | M | K |

*FIG. 11*

METHOD AND APPARATUS PROVIDING IMPROVED INTERMODULATION DISTORTION PROTECTION

TECHNICAL FIELD

This invention relates in general to wireless or wireline communication devices and the systems upon which they operate. More generally, the present invention relates to a method and apparatus providing second order intermodulation distortion (IM2) protection for receivers and particularly direct conversion and/or Zero-IF receivers.

BACKGROUND

In direct conversion and Zero-IF receivers, it is necessary to maintain the spectral purity of the channel used for reception. Because of limited narrow band selectivity, second order intermodulation distortion (IM2) presents an undesired spectral component within the signal band of interest. This occurs when two or more interfering signals, whose difference in frequency is less than the IF bandwidth of the desired signal, mix with one another due to some second order nonlinearity and produce a baseband spectral component. To minimize the effects of second order intermodulation within critical circuit blocks in the signal path, it is known in the art to use differential circuits. In theory, differential circuits have infinite attenuation to second order intermodulation distortion. In reality, this is far from the truth; due, in no small part, to device mismatches, parametric imbalance, imperfect layout, and other device characteristic inequalities that cause imbalances and provides a lower than desired second order input intercept point (IIP2). As will be appreciated by those skilled in the art, the best IIP2 achieved to date in the integrated mixer art is somewhere in the neighborhood of +67 dBm. For several high performance applications, this rejection rate falls nearly 13 dB short of system requirements.

It would be extremely advantageous, therefore, to provide a method and apparatus providing improved second order intermodulation distortion performance. It would be of greater advantage to apply this methodology to wireless and wireline communications, devices that employ mixer circuits, switches, and other components that exhibit parametric mismatch or imbalance.

BRIEF DESCRIPTION OF THE DRAWINGS

The features of the present invention, which are believed to be novel, are set forth with particularly in the appended claims. The invention, together with further objects and advantages thereof, may best be understood by reference to the following description, taken in conjunction with the accompanying drawings, in the several figures in which like reference numerals identify like elements, and in which:

FIG. 11 is a timing diagram for use in association with the devices of FIGS. 9 and 10.

DETAILED DESCRIPTION OF THE PREFERRED EMBODIMENT

Figure 1:
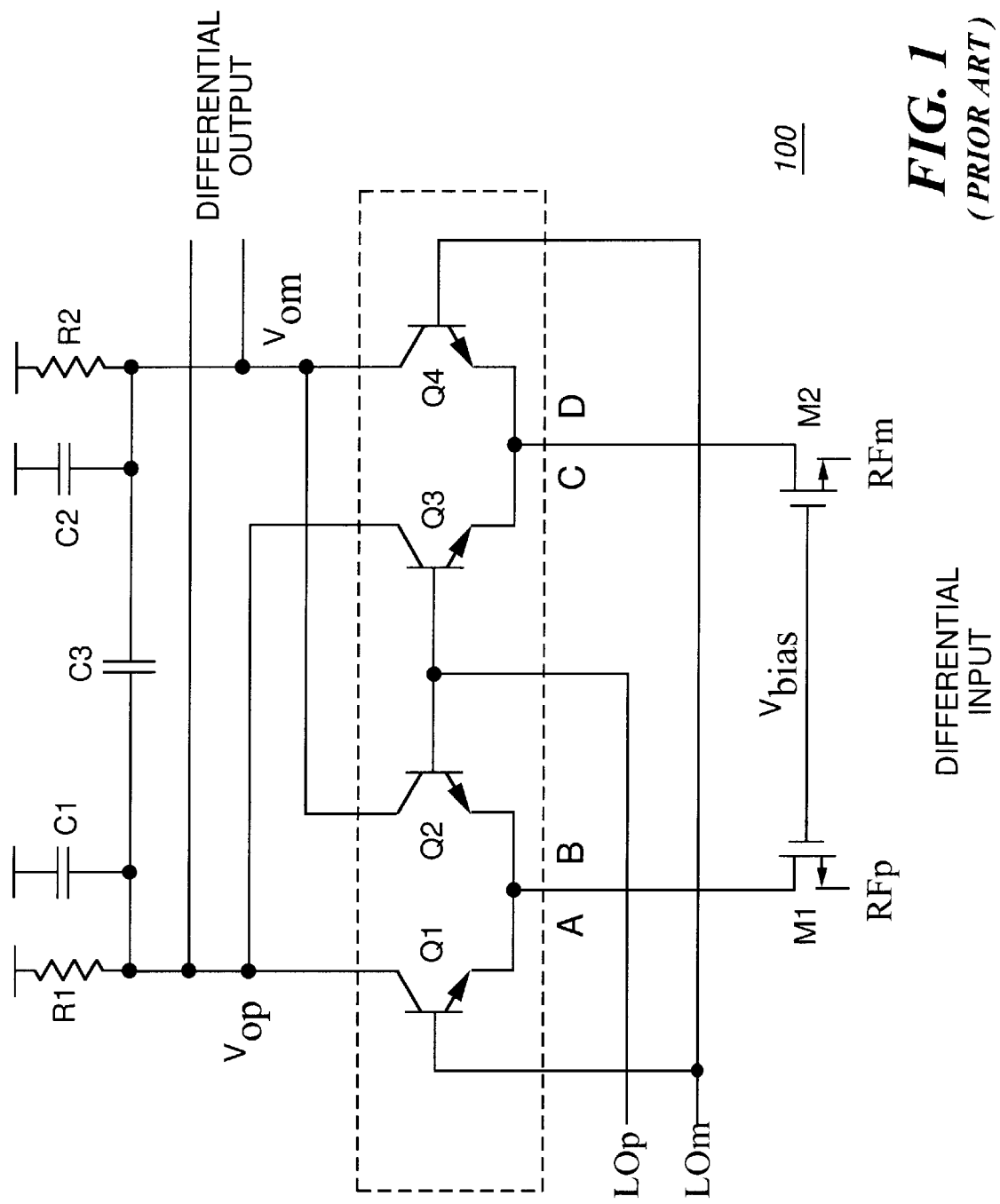
FIG. 1 is a differential RF mixer circuit as known in the art.

While the specification concludes with claims defining the features of the invention that are regarded as novel, it believed that the invention will be better understood from a consideration of the following description in conjunction with the drawing figures, in which like reference numerals are carried forward.

The present invention has applications for both wireless and wireline communication devices, such as, for example, modems, cellular and PCS phones, two-way radios, pagers and the like. By way of example and not by way of limitation, the following description is applied primarily to mixer circuits and particularly to radio frequency (RF) mixer circuits.

As will be appreciated by those skilled in the art, a mixer is essentially a nonlinear circuit and may be characterized by the following equation:

$$V_{out} = a_1 \cdot (V_{1o} \cdot V_{rf}) + a_2 \cdot (V_{1o} \cdot V_{rf})^2 + a_3 \cdot (V_{1o} \cdot V_{rf})^3 \quad (1)$$

Second order intermodulation originates from the second term in Equation 1, when two interfering signals mix with each other through a second order nonlinearity to produce an intermodulation product at the sum and difference frequencies of the two interferers. In an ideal differential mixer, coefficient $a_2$ is zero, resulting in no intermodulation distortion. In reality, however, imbalances within a differential mixer, typically caused by mismatches in mixer device characteristics, imperfect layout, and other static imbalances, causes coefficient $a_2$ to be a small, fixed constant. This results in a finite amount of intermodulation distortion. To reduce the amount of intermodulation distortion, dynamic matching is utilized. In accordance with the present invention, dynamic matching transforms coefficient $a_2$ from a fixed constant into a function of time.

$$a_2 \rightarrow f(t)$$

Depending on the choice of $f(t)$, the IM2 distortion generated by the second term in Equation 1 can be:

1) translated up in frequency where it can be attenuated by filtering, or
2) spread over a range of frequencies such that the contribution of IM2 within the signal band of interest is insignificant.

To fully understand the mechanism by which dynamic matching works, the following mathematical description is given where $f(t)$ is chosen to be a tone signal defined as $\cos\omega_x t$, thereby letting $$V_{rf} = E_1 \cdot \cos \omega_1 t = E_1 \cdot \cos \omega_2 t \quad (2)$$

$$V_{1o} = E_2 \cdot \cos \omega_{1o} t \qquad (3)$$

and substituting into the second term of Equation 1 yields the following second order intermodulation terms $$a_2 \cdot \frac{(E_1 \cdot E_2)^2}{2} \cdot [\cos(\omega_1 + \omega_2)t + \cos(\omega_1 - \omega_2)t] \qquad (4)$$

Choosing $a_2 = \cos \omega_x t$, substituting it into Equation 4 yields:

IM2 Distortion Components:

$$\cos \omega_x t \cdot \frac{(E_1 \cdot E_2)^2}{2} \cdot \cos(\omega_1 + \omega_2)t = \\ \frac{(E_1 \cdot E_2)^2}{4} \cdot [\cos(\omega_x - \omega_1 - \omega_2)t + \cos(\omega_x + \omega_1 + \omega_2)t] \qquad (5)$$

$$\cos \omega_x t \cdot \frac{(E_1 \cdot E_2)^2}{2} \cdot \cos(\omega_1 - \omega_2)t = \\ \frac{(E_1 \cdot E_2)^2}{4} \cdot [\cos(\omega_x - \omega_1 + \omega_2)t + \cos(\omega_x + \omega_1 - \omega_2)t] \qquad (6)$$

It will be appreciated by those skilled in the art upon review of equations 5 and 6, that the IM2 distortion components have been translated up in frequency by $\omega_x$. By carefully selecting $\omega_x$, one can place the IM2 distortion components outside the frequency band of interest where they can be attenuated by filtering. An added benefit of dynamic matching is that it also translates any DC component generated from a second order nonlinearity up in frequency by $\omega_x$ where it too can be filtered. This can be seen by substitution of Equations 2 and 3 into the second term of Equation 1 thereby yielding the following DC term:

$$a_2 \cdot \frac{(E_1 \cdot E_2)^2}{2} \qquad (7)$$

To understand how IM2 distortion components are spread over frequency, consider a pseudo-random sequence function, $f_{pseudo}(t)$, which has the following spectrum in the frequency domain:

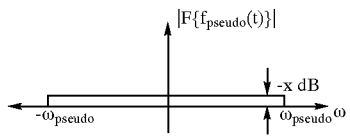

Now using the fact that multiplication in the time domain is convolution in the frequency domain, the composite response of $$a_2 \cdot (V_{1o} \cdot V_{rf})^2 \to f_{pseudo}(t) \cdot (V_{1o} \cdot V_{rf})^2 \leftrightarrow \mathcal{F}\{f_{pseudo}(t)\} \circledast \mathcal{F}\{(V_{1o}(t) \cdot V_{rf}(t))^2\}$$

is graphically shown below:

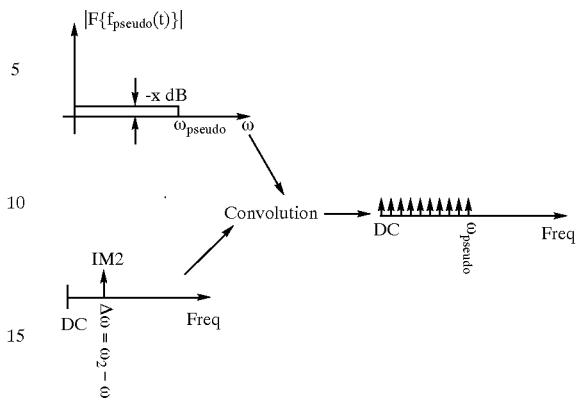

By choosing $f_{pseudo}(t)$ to have insignificant magnitude, $-x$ dB, in the frequency domain, the IM2 distortion component will be scaled by $-x$ dB and spread over a wider frequency range than the desired frequency band.

As previously stated, the basic problem of second order intermodulation distortion within an integrated, fully differential mixer arises from mismatches or imbalances between like devices within the circuit (hereinafter referred to as a parametric mismatch). For the differential mixer 100 shown in FIG. 1, the main source of IM2 distortion originates from mismatches in the quadrature switching devices (Q1, Q2, Q3, Q4). Improved balance in the differential mixer 100 of FIG. 1 can be achieved by dynamically matching these devices.

Figure 2:
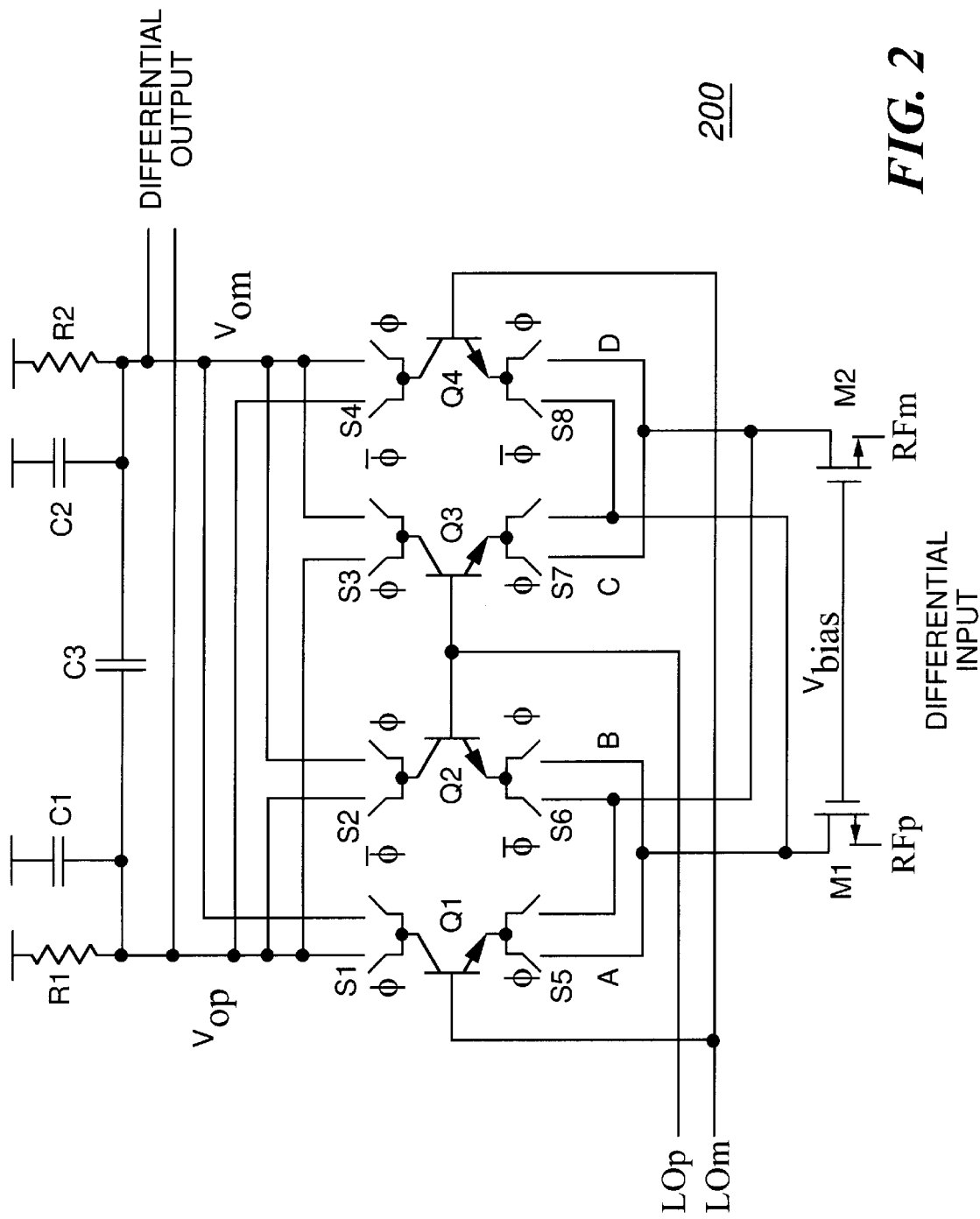
FIG. 2 is a first embodiment of a differential RF mixer circuit employing dynamic matching in accordance with the present invention.
Figure 3:
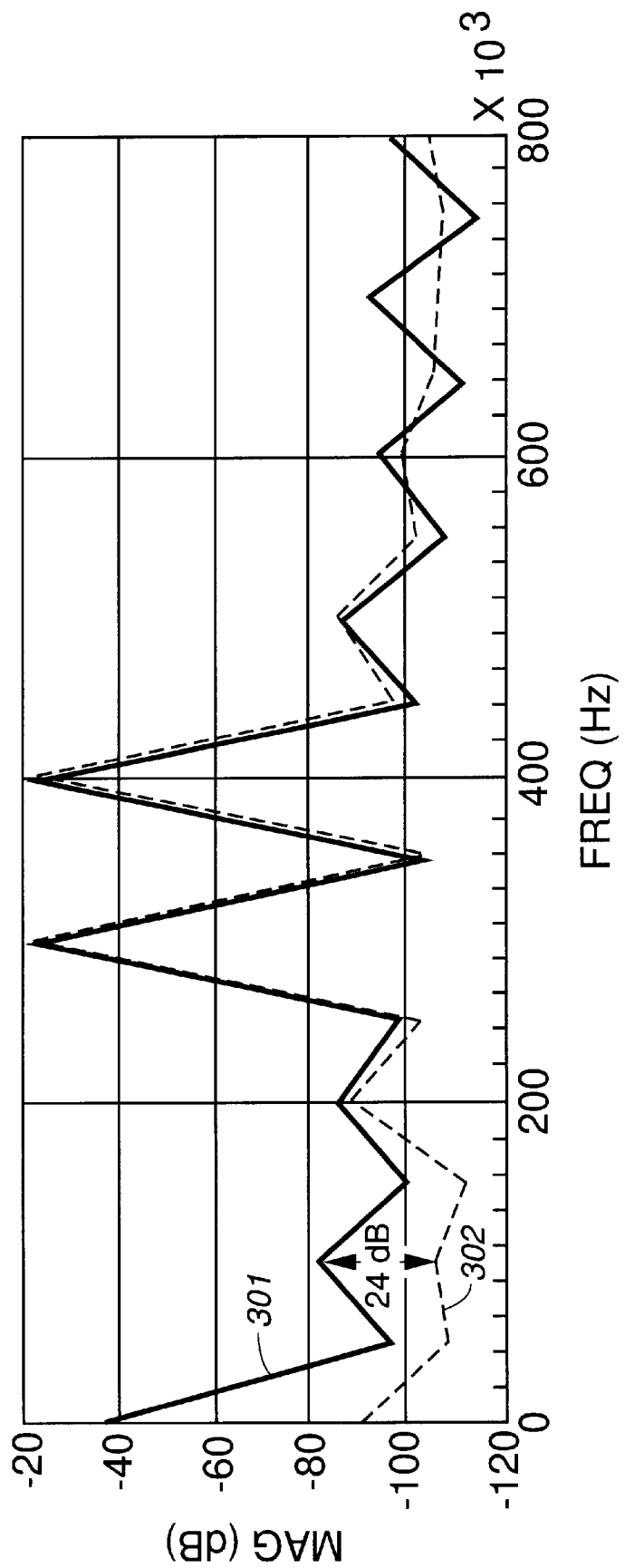
FIG. 3 is a graph comparing the IM2 performance of the mixers of FIGS. 1 and 2.

FIG. 2 shows a differential RF mixer circuit 200 employing dynamic matching in accordance with the present invention. In accordance with this embodiment, a switching network comprising switches $S_1$–$S_8$ has been added to rotate the effective positions of transistor pairs Q1 and Q4 between positions A and D and the positions of transistor pairs Q2 and Q3 between positions B and C at a commutating frequency. The result of cyclically changing the position of each transistor pair is that the imbalance in the circuit elements may be modulated. By choosing the modulating frequency to be well beyond the corner frequency of the single pole filter formed by R1, C1, C3, C2, and R2, the IM2 distortion component may be eliminated by translating the IM2 distortion components to a frequency different from the desired frequency and attenuating the IM2 distortion via the single pole filter. The IM2 performance of the mixer 200 of FIG. 2 is illustrated in FIG. 3. Of note, the IM2 distortion 302 as exhibited by the mixer 200 is 24 decibels (dB) below that exhibited by the mixer 100 of FIG. 1.

During operation, the mixer circuit 200 receives an RF signal as an input for application to the emitters of transistors $Q_1$–$Q_4$. Likewise, the mixer receives a local oscillator (LO) reference signal as an input for application to the bases of transistors $Q_1$–$Q_4$. As is known, the application of these signals to devices $Q_1$–$Q_4$ will cause them to be mixed and provide an output which is the product of the RF signal and the local oscillator signal.

In accordance with the present embodiment, switches $S_1$–$S_8$ are located at the input and the output of transistor $Q_1$–$Q_4$, respectively. Under the operation of a control or mitigation signal ($\phi, \bar{\phi}$), switches $S_1$–$S_8$ are operated at a frequency $f_{comm}$ different than the frequency of the desired output in order to modulate the imbalance exhibited by transistors $Q_1$–$Q_4$. As previously stated, the mitigation signal frequency can be selected so as to promote the attenuation of the undesired IM2 distortion components. This is accomplished by frequency translating the desired signal components twice. Once, by switches $S_5-S_8$, to translate the desired signal to a frequency different than the desired frequency and again by switches $S_1-S_4$ to recover the desired signal. The undesired signal components are translated once by the switches $S_1-S_4$ at the output of devices $Q_1-Q_4$ to translate the undesired signal components to a frequency different from the desired frequency prior to filtering.

Of note, the mitigation signal ($\phi,\bar{\phi}$) anticipated by the present embodiment is a square wave. Notwithstanding, it will be appreciated by those skilled in the art that the mitigation signal may comprise any periodic wave form such as, for example, sinusoidal waves or saw tooth waves. In the alternative, frequency translation may be achieved by switching the polarity of the inputs and outputs of the elements exhibiting imbalance, for example, transistors $Q_1-Q_4$ at the frequency of $\omega_{comm}$.

One concern regarding this approach is the introduction of undesirable spurs. Specifically, the spurs of concern are those originating from the mixing of the mitigation signal at frequency $f_{comm}$ and any signal in the frequency range of local oscillatory frequency $\pm \Delta f + f_{comm}$ ($\Delta f <=$ IF bandwidth) which are then down converted to baseband by mixing with the LO. Notwithstanding this concern, experimentation and empirical data show that such spurs can be controlled by the choice of $f_{comm}$.

A second concern regarding this approach is the overall device noise figure. Since several switching devices $S_1-S_8$ have been added to the mixer 200, the noise figure of the new mixer might potentially be higher. Fortunately, devices $S_1-S_8$ act as ON-OFF switches with a very low ON resistance of 10 to 20 Ohms. Their noise figure contribution of these devices is not significant.

As will be appreciated, there are a number of ways in which this switching technique can be applied to the conventional Gilbert Cell mixer topology of FIG. 2. One such alternative is shown in FIG. 4.

Figure 4:
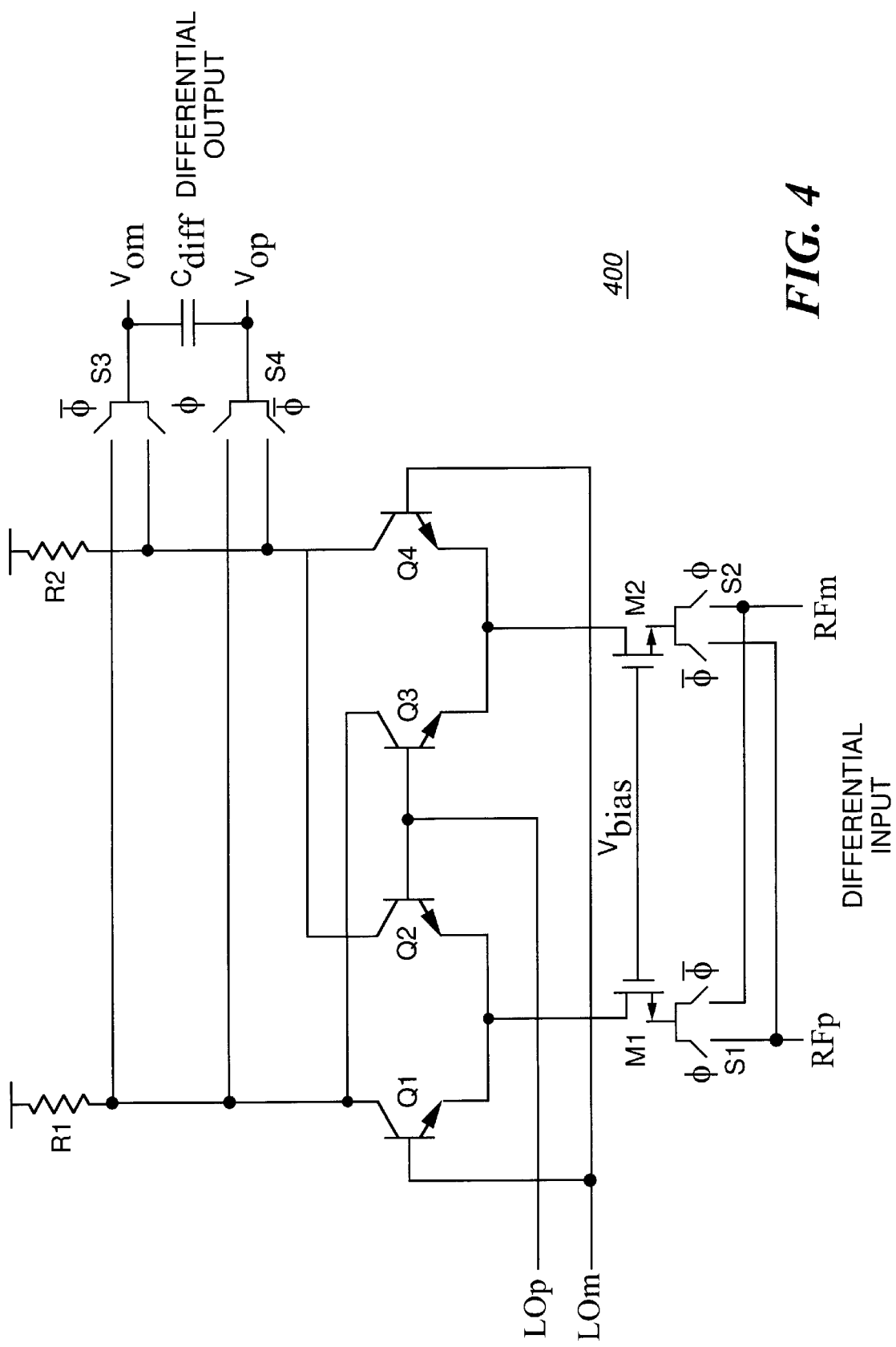
FIG. 4 is a second embodiment of a differential RF mixer circuit employing dynamic matching in accordance with the present invention.

FIG. 4, like FIG. 2, depicts a Gilbert Cell mixer circuit employing dynamic matching to overcome the effects of parametric mismatch between devices $Q_1, Q_2, Q_3, Q_4$. As will be appreciated upon closer inspection, the primary different between FIG. 4 and FIG. 2 is the location and number of commutating switches required to perform dynamic matching.

With reference to FIG. 4, the commutating switches $S_1-S_4$ are located at the inputs and the outputs, respectively, of the mixer circuit 400 as opposed to the inputs and outputs of the devices $Q_1-Q_4$ as shown in FIG. 2. This modification reduces the required number of commutating switches and yet exhibits similar performance as the mixer 200 shown in FIG. 2.

It will be appreciated by those skilled in the art that the switching network of the present invention may be diodes, field-effect transistors (FET), transmission gates, bipolar junction transistors (BJT) or any other switching devices and/or technology. FIG. 4 is presented to articulate the point that there are numerous ways to deploy commutating switches within the topology of a mixer circuit to improve the IM2 distortion caused by device imbalance; such devices or elements to include transistors, resistors, diodes, inductors, capacitors, transformers, active baluns, and the like, without departing from the spirit of the present invention.

Figure 5:
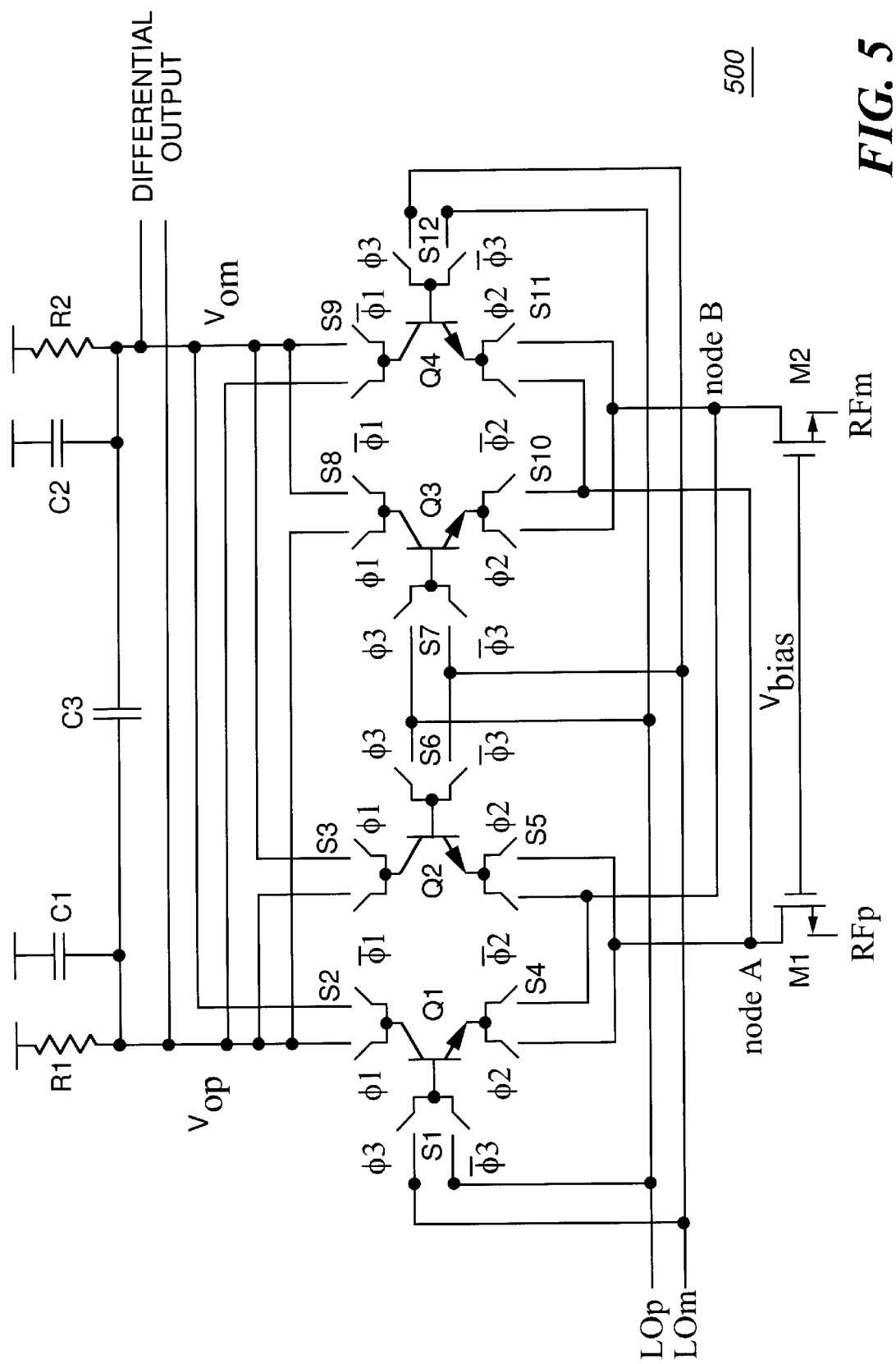
FIG. 5 is an embodiment of an RF mixer circuit employing spreading to achieve dynamic matching in accordance with the present invention.
Figure 6:
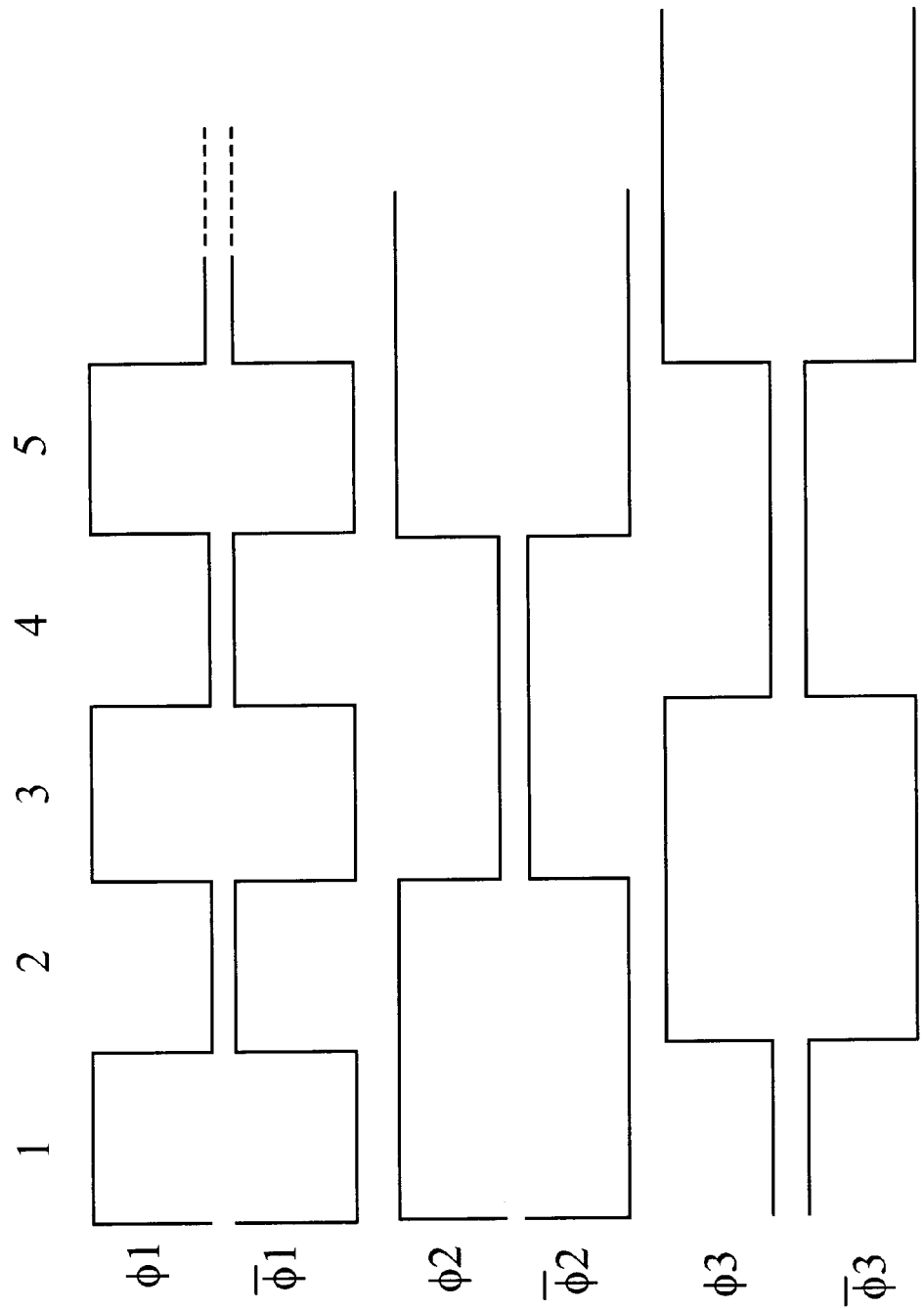
FIG. 6 is a timing diagram for use in association with the device of FIG. 5.

In addition to frequency translation, spreading is an alternative method of achieving dynamic matching. With reference to FIG. 5, a differential RF mixer circuit 500 employing spreading techniques to achieve dynamic matching of elements exhibiting parametric mismatch is shown. FIG. 6 is a timing diagram showing the operation thereof.

The circuit 500 works as follows. With reference to FIG. 6, during period 1, the collector of $Q_1$ is connected to Vop, the emitter of $Q_1$ is connected to node A, and the base of $Q_1$ is connected to $LO_P$. During period 2, the collector of Q1 is connected to Vom, the emitter is connected to node A, and the base is connected to $LO_m$. At this point, Q1 has effectively been switched into the position of Q2 as shown in period 1. During period 3, the collector of Q1 is connected to Vop, the emitter is connected to node B, and the base is connected to $LO_M$. Here, Q1 has been switched into the location of Q3 as shown in period 1. Finally, during period 4, the collector of Q1 is connected to Vom, the emitter is connected to node B, and the base is connected to $LO_P$. Q1 has now effectively been switched into the position of Q4 as shown in period 1. This is the end of the cycle and during period 5, transistor Q1 will return to its original position. By manipulating the switching network ($S_1-S_{12}$) connections, to and from transistors Q1, Q2, Q3, and Q4 can be altered to effectively rotatge transistors $Q_1-Q_4$ through different physical positions within the mixer circuit 500 and, hence, randomize or spread the second order distortion term. Simulations performed with this topology show a greater than 20 dB improvement as compared to the conventional mixer topology 100 of FIG. 1. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims. For example, dynamic matching as described herein can be applied to any RF component exhibiting parametric mismatch; such components to include resistors, capacitors, inductors, diodes, transistors, transformers, active baluns, such as single-ended to differential converter, and the like. These techniques can likewise be applied to any mixer topology and may be further employed within a wireless or wireline communication system.

Figure 7:
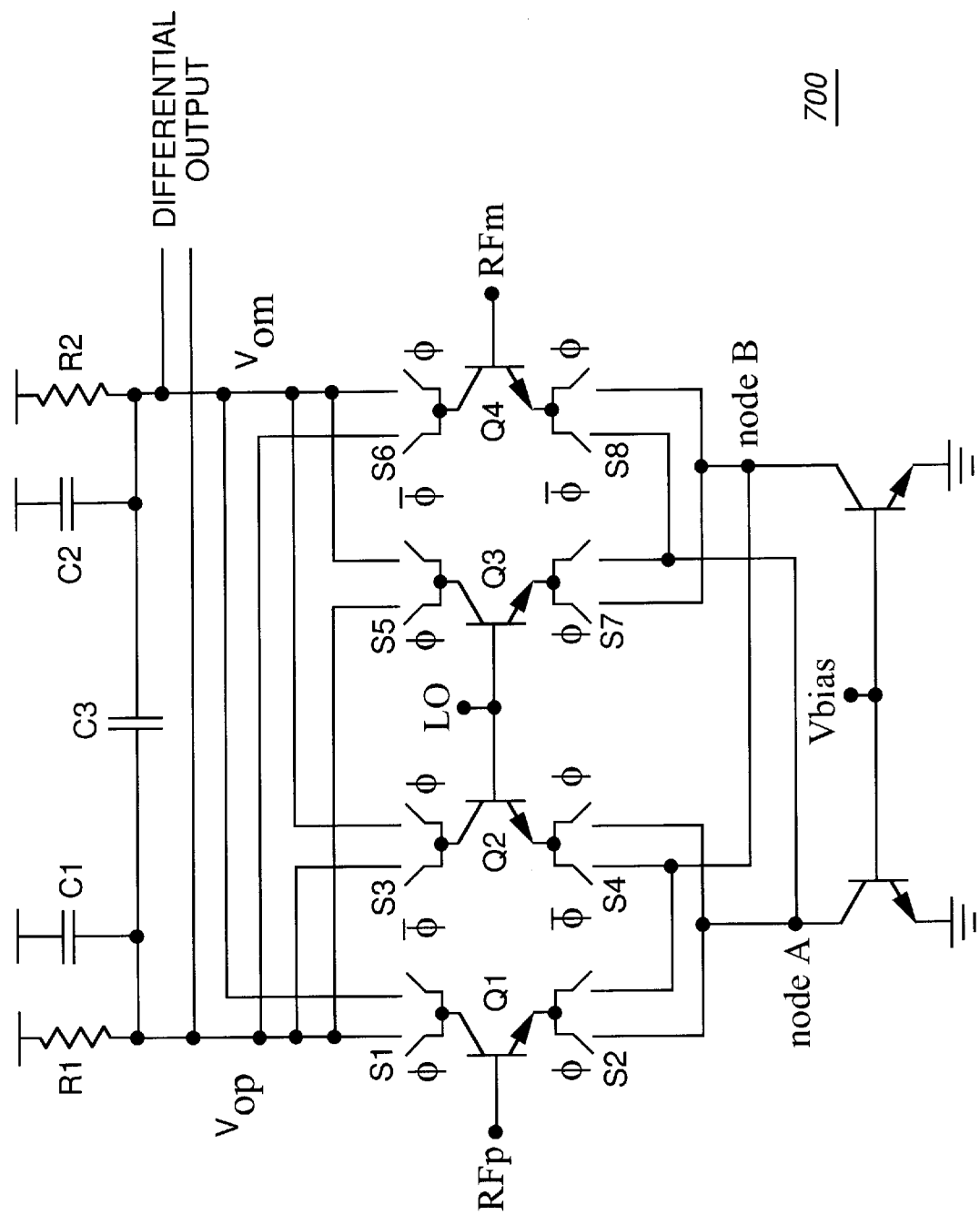
FIG. 7 is an active harmonic mixer employing dynamic matching in accordance with the present invention.

With reference to FIGS. 7–11, the application of switching networks to provide dynamic matching within other mixer topologies is specifically shown. For example, FIG. 7 depicts an active harmonic mixer 700 employing dynamic matching in accordance with the present invention. During operation, when the mitigation signal amplitude is high, ($\phi$), Q1's collector is tied to Vop and its emitter is tied to node A, Q2's collector is tied to Vom and its emitter is tied to node A, Q3's collector is tied to Vop and its emitter is tied to node B, and Q4's collector is tied to Vom and its emitter is tied to node B. During this period, the IM2 distortion component has a defined amplitude, $A_1$, that is unique to the above-defined set of switching network connections. When the mitigation signal goes low, ($\bar{\phi}$), Q1's collector is tied to Vom and its emitter is tied to node B, Q2's collector is tied to Vop and its emitter is tied to node B, Q3's collector is tied to Vom and its emitter is tied to node A, and Q4's collector is tied to Vom and its emitter is tied to node A. During this period, the IM2 distortion component has a second defined amplitude, $A_2$ that is unique to the set of switching network connections associated with the mitigation signal being in the low state. If the mitigation signal toggles at a frequency $f_{sw}$, then the IM2 distortion component amplitude will change from A1 to A2 and back to A1 at the same frequency. By choosing $f_{sw}$ appropriately, the IM2 distortion component can be easily filter by filter stage at the output of the mixer 700.

Figure 8:
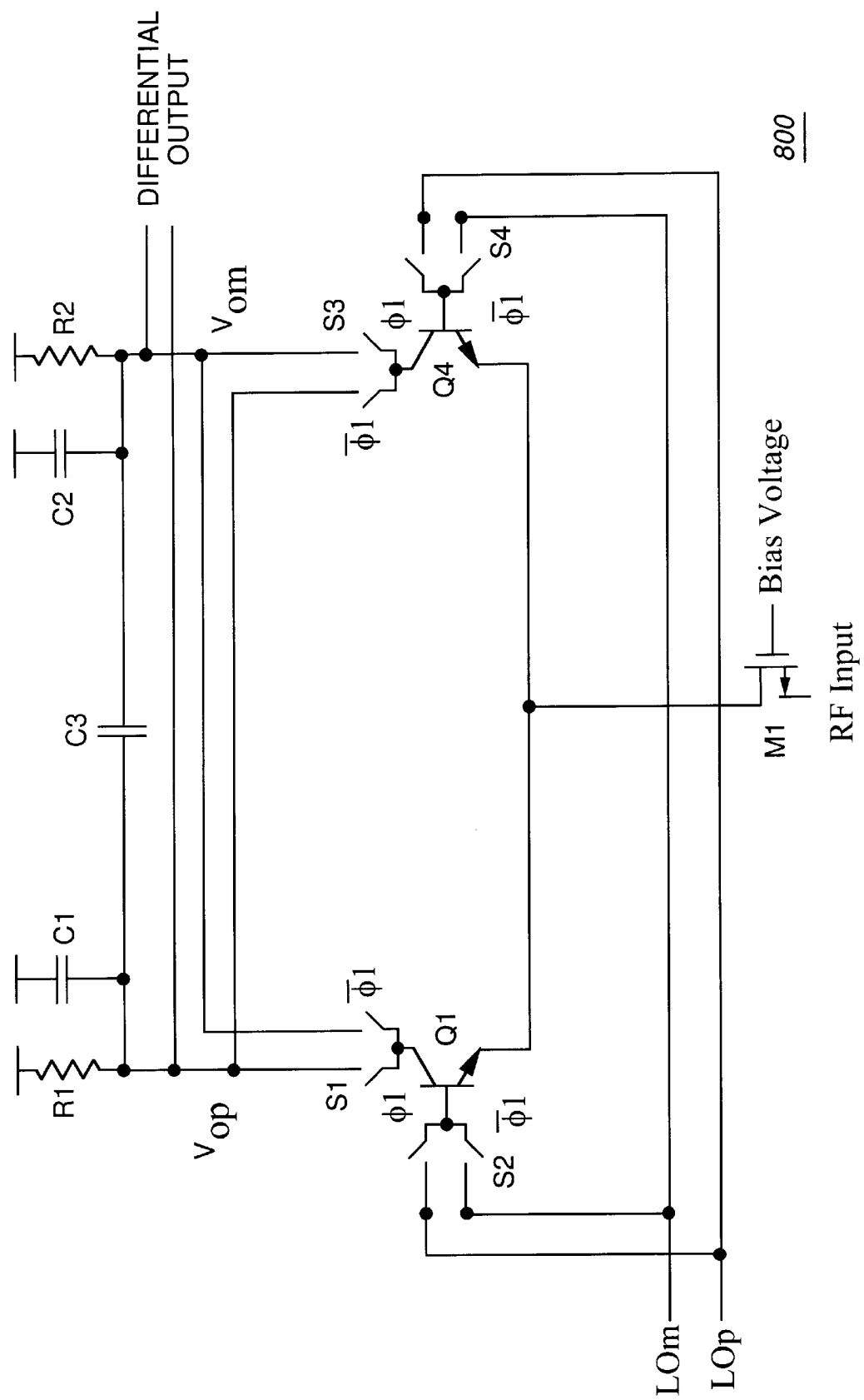
FIG. 8 is a single-balanced mixer employing dynamic matching in accordance with the present invention.

Following this same technique, FIG. 8 depicts a single-balanced RF mixer 800 employing dynamic matching in accordance with the present invention.

Figure 9:
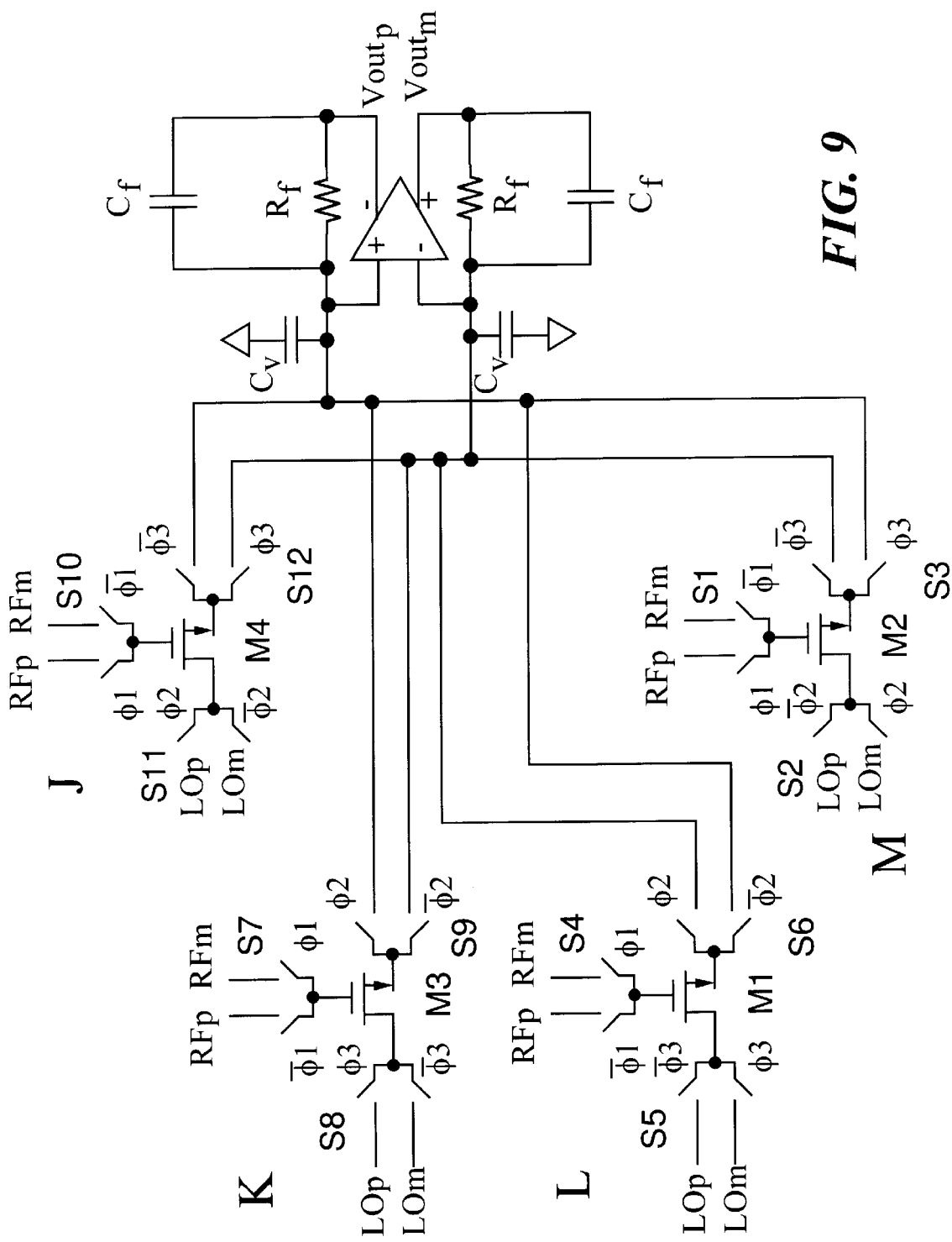
FIG. 9 is a first embodiment of a CMOS down conversion mixer employing dynamic matching in accordance with the present invention.
Figure 10:
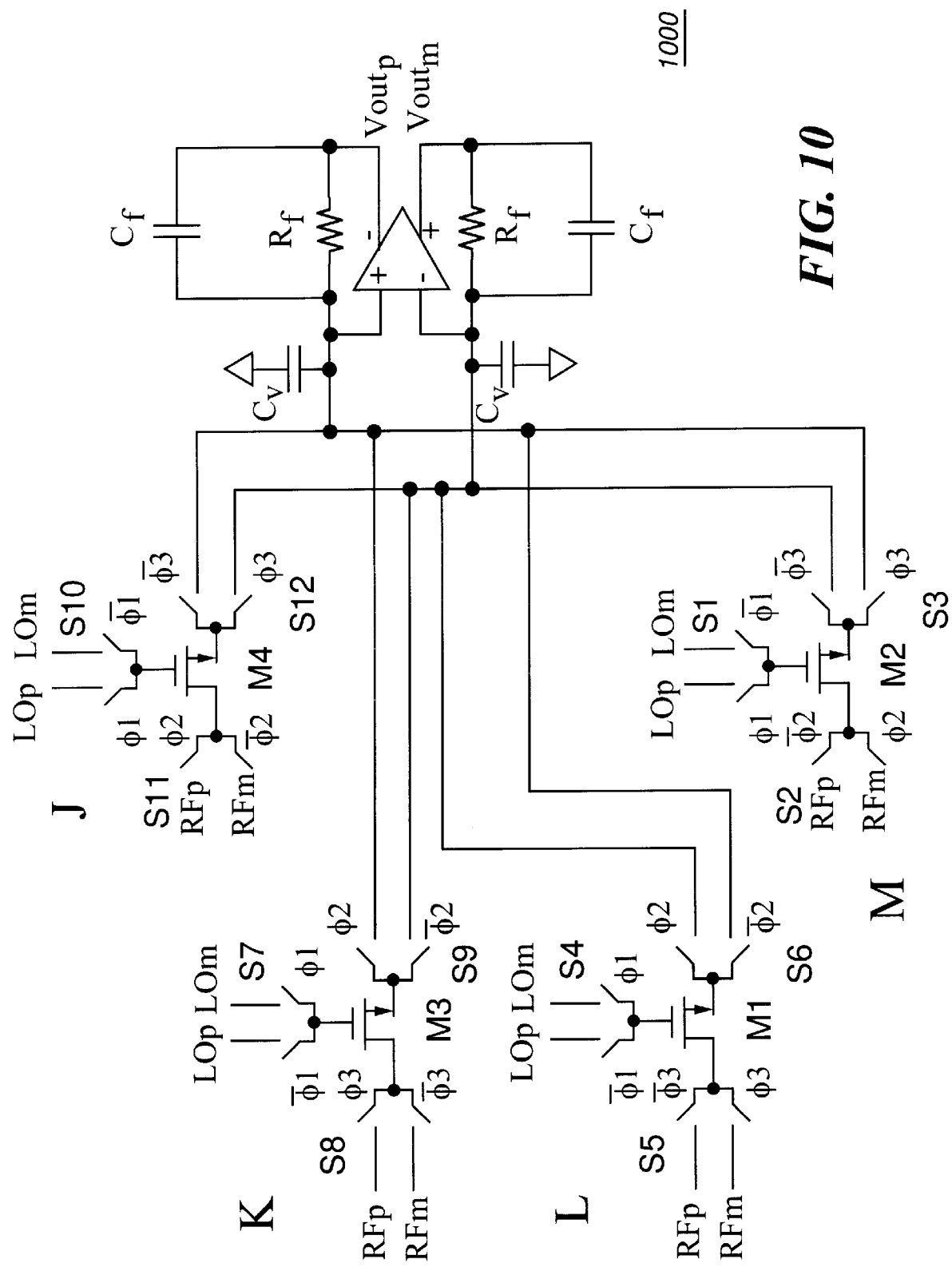
FIG. 10 is a second embodiment of a CMOS down conversion mixer employing dynamic matching.

FIG. 9 is a first embodiment of a CMOS down conversion mixer 900 employing dynamic matching in accordance with the present invention. FIG. 10 is a second embodiment of a CMOS down conversion mixer 1000 employing dynamic matching. FIG. 11 is a timing diagram for use in association with the devices 900 and 1000 of FIGS. 9 and 10. The primary difference between FIGS. 9 and 10 is the application of the input signal to the gates of devices M1–M4 as shown in FIG. 9 as opposed to application of the input signal to the drains of devices M1–M4 as shown in FIG. 10. As will be appreciated by those skilled in the art, the devices M1–M4 operate in saturation in FIG. 10 while they operate in the linear region in FIG. 9.

What is claimed is:

1. A method for improving the second order intermodulation distortion exhibited by a radio frequency (RF) component constituting a RF mixer or a balun, and having a plurality of elements exhibiting parametric mismatch, comprising the steps of:

providing a switching network capable of altering electrical connections to and from the plurality of elements exhibiting parametric mismatch;

applying a desired signal to inputs of the plurality of elements to generate output signals comprising desired and undesired signal components;

manipulating the switching network under control of a periodic mitigation signal to alter electrical connections to and from the plurality of elements at a rate established by the mitigation signal;

frequency translating the desired signal components to a first frequency;

frequency translating the undesired signal components to a second frequency; and filtering the undesired signal components.

2. The method of claim 1, wherein the plurality of elements exhibiting parametric mismatch are selected from the group consisting of capacitors, inductors, transformers, transistors, resistors, and diodes.

3. The method of claim 1, wherein the desired signal is frequency modulated before the step of applying the desired signal to the inputs of the plurality of elements.

4. The method of claim 1, wherein the periodic mitigation signal is a signal selected from the group consisting of: sinusoidal wave, square wave, and saw tooth waves.

5. A method for improving the second order intermodulation distortion of a radio frequency (RF) component constituting a RF mixer or a balun, and having a plurality of elements exhibiting parametric mismatch, comprising the steps of:

applying a desired signal to inputs of the plurality of elements exhibiting parametric mismatch to generate output signals comprising desired and undesired signal components; and spreading the undesired signal across a range of frequencies by application of a spreading sequence at the inputs and outputs of the plurality of elements exhibiting parametric mismatch.

6. The method of claim 5, wherein the plurality of elements exhibiting parametric mismatch are selected from the group consisting of capacitors, inductors, transformers, transistors, resistors, and diodes.

7. The method of claim 5, wherein the spreading signal is a pseudo-random code.

8. A radio frequency (RF) mixer circuit having a plurality of elements exhibiting parametric mismatch, said elements generating desired and undesired signal components during mixing, said mixer comprising:

inputs for receiving a desired signal and a local oscillator signal;

an output for providing an output signal comprising a product of the desired signal and the local oscillator signal; and a mitigation signal applied to the input and the output to frequency translate or spread the undesired signal components generated by the plurality of elements exhibiting parametric mismatch.

9. The mixer of claim 8, further comprising at least one switching network.

10. The mixer circuit of claim 8, wherein the mitigation signal is applied to switching network switches at the input and the output of the RF mixer.

11. The mixer of claim 8, wherein the mitigation signal is applied to switching network switches disposed within the mixer circuit to randomize or spread the undesired signal components over a band of frequencies.

12. The mixer circuit of claim 8, wherein the plurality of elements exhibiting parametric mismatch are selected from the group consisting of transistors, resistors, inductors, diodes, and transformers.

13. The mixer circuit of claim 8, wherein a switching network switch is a device selected from the group consisting of diodes, field effect transistors (FET), transmission gates, and bipolar junction transistors (BJT).

14. A wireless or wireline communication device having a mixer circuit comprising a plurality of elements exhibiting parametric mismatch, said elements generating desired and undesired signal components during mixing, said mixer comprising:

inputs for receiving a desired signal and a reference signal;

an output coupled to the plurality of elements exhibiting parametric mismatch for providing an output signal comprising a product of the desired signal and the reference signal; and a mitigation signal applied to the input and the output to frequency translate or spread the undesired signal components generated by the plurality of elements exhibiting parametric mismatch.

15. The device of claim 14, further comprising at least one switching network.

16. The device of claim 14, wherein the mitigation signal is applied to switching elements at the input and the output of the mixer circuit.

17. The device of claim 14, wherein the mitigation signal is applied to switching network elements disposed within the mixer circuit.

18. The device of claim 14, wherein the plurality of elements exhibiting parametric mismatch are selected from the group consisting of transistors, diodes, resistors, inductors, and transformers.

19. A method for improving the second order intermodulation distortion exhibited by components constituting mixers or baluns having parametric mismatch, comprising the steps of:

receiving a desired signal;

frequency translating the desired signal by a translating frequency to generate a translated signal;

applying the translated signal to inputs of a plurality of elements exhibiting parametric mismatch to generate outputs comprising translated desired and undesired signal components;

frequency translating the translated desired signal components by the translating frequency to recover the desired signal;

frequency translating the undesired signal by the translating frequency to translate the undesired signal components;

filtering the translated and undesired signal components; and providing a switching network capable of altering electrical connections to and from the plurality of elements to physically change element positioning within the circuit.

* * * * *